(12) United States Patent
Cadieu

(10) Patent No.: US 9,040,982 B2
(45) Date of Patent: May 26, 2015

(54) DEVICE WITH LIGHT-RESPONSIVE LAYERS

(71) Applicant: Research Foundation of the City University of New York, New York, NY (US)

(72) Inventor: Fred J. Cadieu, Melrose, MA (US)

(73) Assignee: Research Foundation of the City University of New York, New York, NY (US)

(*) Notice: Subject to any disclaimer, the term of this patent is extended or adjusted under 35 U.S.C. 154(b) by 0 days.

(21) Appl. No.: 13/944,278

(22) Filed: Jul. 17, 2013

(65) Prior Publication Data

US 2014/0021468 A1 Jan. 23, 2014

Related U.S. Application Data

(60) Provisional application No. 61/673,046, filed on Jul. 18, 2012.

(51) Int. Cl.
*H01L 29/10* (2006.01)
*H01L 31/0352* (2006.01)
*H01L 31/0264* (2006.01)

(52) U.S. Cl.
CPC ...... *H01L 31/03529* (2013.01); *H01L 31/0264* (2013.01)

(58) Field of Classification Search
CPC .................. H01L 31/0264; H01L 31/03529
USPC ....... 257/43, 431, E27.12; 438/104, 249, 608
See application file for complete search history.

(56) References Cited

U.S. PATENT DOCUMENTS

| 2011/0002154 A1* | 1/2011 | Mitani et al. ............... 365/148 |
| 2011/0011632 A1* | 1/2011 | Nakao et al. ............... 174/257 |
| 2012/0012807 A1* | 1/2012 | Yamaguchi et al. ........... 257/4 |

FOREIGN PATENT DOCUMENTS

WO   WO 2011053297 A1 *  5/2011

* cited by examiner

*Primary Examiner* — Fernando L Toledo
*Assistant Examiner* — Adam S Bowen
(74) *Attorney, Agent, or Firm* — Schmeiser, Olsen & Watts, LLC; Peter J. Mikesell

(57) ABSTRACT

An electrical device with light-responsive layers is disclosed. One or more electrically conducting stripes, each insulated from each other, are deposited on a smooth surface of a substrate. Then metal oxide layers, separated by a composite diffusion layer, are deposited. On top of the topmost metal oxide layer another set of elongated conductive strips are disposed in contact with the topmost metal oxide layer such that junctions are formed wherever the top and bottom conducting stripes cross. The resulting device is light responsive only when a certain sign of bias voltage is applied and may be used as a photodetector. An advantage that may be realized in the practice of some disclosed embodiments of the device is that this device may be formed without the use of conventional patterning, thereby significantly reducing manufacturing difficulty.

22 Claims, 12 Drawing Sheets

| Layer | Gas | Sample 1 (min) | Sample 1 (Å) | Sample 2 (Time) | Sample 2 (Å) | Sample 3 (Time) | Sample 3 (Å) | Sample 4 (Time) | Sample 4 (Å) |
|---|---|---|---|---|---|---|---|---|---|
| SiO$_2$ | N/A | N/A | 12.1 | N/A | 12.2 | N/A | 5 | N/A | 6.6 |
| First metal oxide layer | 34 mTorr O$_2$ | 20 | 102.9 | 10 | 65.2 | 15 | 63.6 | 5 | 27.5 |
| Diffusion layer | 12 mTorr Ar | 11 | 39.6/21.2 | 5 | 12.4/4.8 | 8 | 40.7/12.1 | 3 | 12.9/8.7 |
| Second metal oxide layer | 34 mTorr O$_2$ | 8 | 47.7 | 2.5 | 51.4 | 4 | 33.1 | 1.5 | 12.8 |

DEVICE WITH LIGHT-RESPONSIVE LAYERS

CROSS-REFERENCE TO RELATED APPLICATIONS

This application claims priority to and benefit of U.S. provisional patent application No. 61/673,046 (filed Jul. 18, 2012) the entirety of which is incorporated herein by reference.

BACKGROUND OF THE INVENTION

The subject matter disclosed herein relates to a device with light-responsive layers. Such a device is useful, for example, as a photodetector and/or an image capture device, such as a digital camera or video recorder.

Conventional photodetectors, such as charged-coupled devices (CCD), present certain manufacturing challenges. One of these challenges is the need to pattern microengineered structures. The need to pattern significantly increases the difficulty in manufacturing photodetector devices which results in increased costs to the consumers. The discussion above is merely provided for general background information and is not intended to be used as an aid in determining the scope of the claimed subject matter.

BRIEF DESCRIPTION OF THE INVENTION

An electrical device with light-responsive layers is disclosed. One or more electrically conducting stripes, each insulated from each other, are deposited on a smooth surface of a substrate. Then metal oxide layers, separated by a composite diffusion layer, are deposited. On top of the topmost metal oxide layer another set of elongated conductive strips are disposed in contact with the topmost metal oxide layer such that junctions are formed wherever the top and bottom conducting stripes cross. The resulting device is light responsive and may be used as a photodetector. An advantage that may be realized in the practice of some disclosed embodiments of the device is that this device may be formed without the use of conventional patterning, thereby significantly reducing manufacturing difficulty.

In one embodiment, a light-responsive device is disclosed. The device comprises a plurality of first elongated electrically conductive strips including a first strip. A plurality of second elongated electrically conductive strips, including a second strip, is also present. The first strip extends in a first direction and the second strip extending in a second direction, different than the first direction. The strips cross to form a junction, the second strip being spaced from the first strip such that the junction is between the first strip and the second strip. A multilayered structure is disposed between the plurality of first elongated electrically conductive strips and the plurality of second elongated electrically conductive strips. The multilayered structure comprises a first metal oxide layer, a second metal oxide layer, and a composite diffusion layer, each. The composite diffusion layer is oxygen deficient relative to the first metal oxide layer and the second metal oxide layer. The first and second metal oxide layers have different thicknesses. The junction resists electrical current when not biased with a first polarity or not exposed to light and the first junction is less resistive to electrical current when biased and exposed to light.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which:

FIG. 3 is a table showing compositions of several multi-layered structures;

DETAILED DESCRIPTION OF THE INVENTION

Figure 1A:
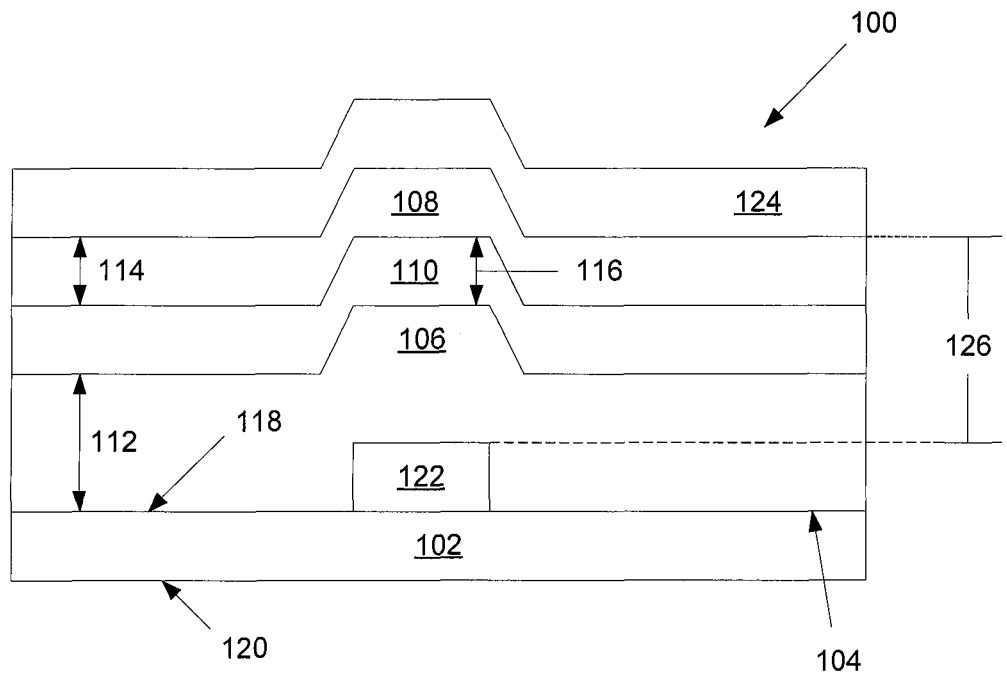
FIG. 1A is a schematic cross section of an exemplary light-responsive device and FIG. 1B is a schematic cross section of another exemplary light-responsive device.
Figure 4:
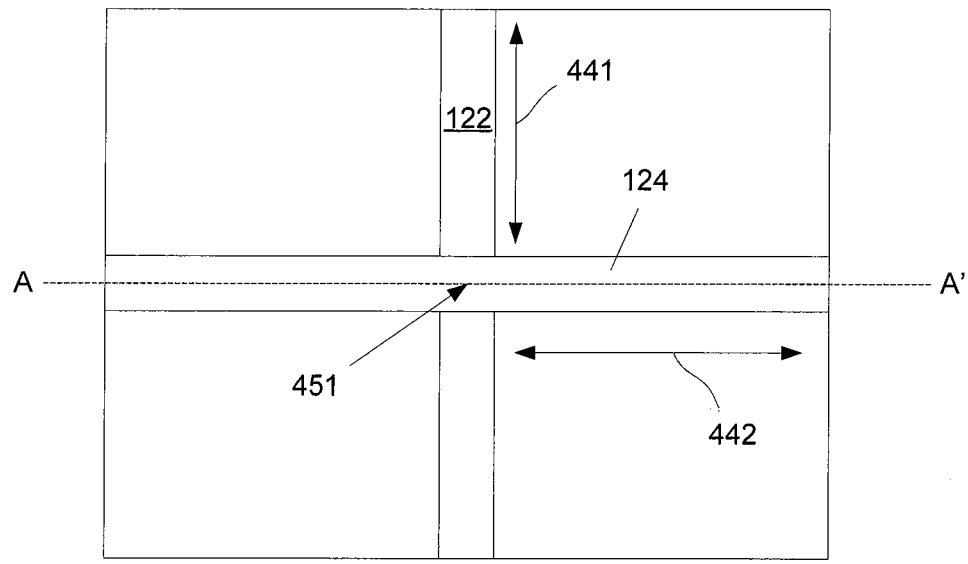
FIG. 4 is a is a top view of the device of FIG. 1.

FIG. 1A is a schematic cross section of a light-responsive device 100 along line A-A' (see FIG. 4). Generally, the device comprises a thin film structure, of approximately 10 nm thickness (see thickness 126), that exhibits a high lateral electrical resistance and also a high resistance measured across the thickness of the film structure. A special feature of the device 100 is that the through-film electrical resistance can be changed by exposure to certain wavelengths of light and, in some cases, for light across the entire visible and near infrared range of light wavelengths. The change in the electrical resistance also exhibits a diode-type character in that the change in electrical resistance upon exposure to light only occurs when a bias voltage is applied in what is termed the negative direction.

The device 100 comprises an insulating substrate 102 with a smooth surface 104. A smooth surface is defined as a surface having a roughness sufficient to promote x-ray reflectivity. Generally, a surface roughness of twenty angstroms (measured as the distance from peak to valley) or less is sufficient. Examples of insulating substrates include surface oxidized silicon (doped or un-doped), quartz, alumina, sapphire and glass substrates that have been sufficiently polished to provide a smooth surface. The insulating substrate 102 has a resistance of at least on the order of 50 megohms between any conducting coated regions. In certain embodiments it may be preferable to use an optically transparent substrate to permit illumination through the substrate 102. The use of a transparent substrate can render the device 100 sensitive to incident light on what would usually be considered as the underside or backside.

Figure 1B:
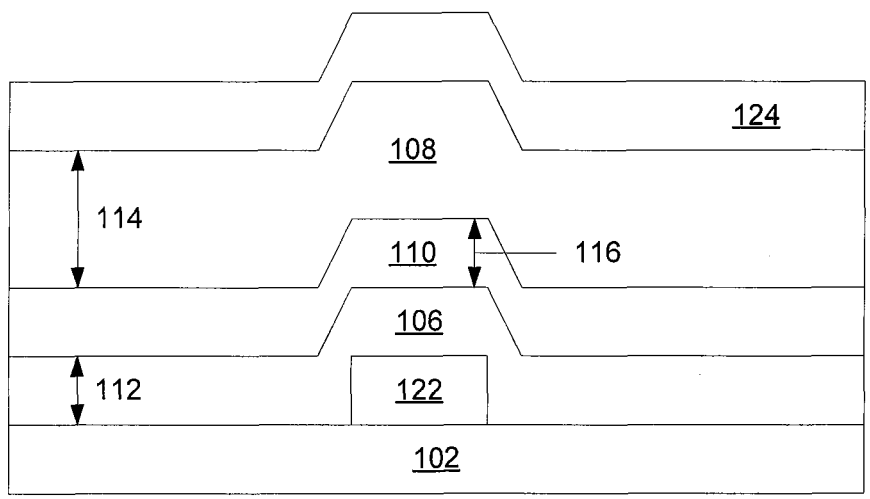

The device 100 comprises a first metal oxide layer 106, a second metal oxide layer 108, a composite diffusion layer 110, a first strip 122 and a second strip 124. The composite diffusion layer 110 is disposed between, and contiguous with, the first metal oxide layer 106 and the second metal oxide layer 108. In the embodiment of FIG. 1 the first metal oxide layer 106 directly contacts the smooth surface 104 of the substrate 102 in regions where the conductive strips (e.g. 124) are absent. The first metal oxide layer 106 also directly contacts the upper surface of the first strip 122. The first metal oxide layer 106 and the second metal oxide layer 108 have different thicknesses but are sufficiently thin so as to render them optically transparent. In the exemplary embodiment of FIG. 1A, the first thickness 112 of the first metal oxide layer 106 is thicker than the second thickness 114 of the second metal oxide layer 108. In one embodiment, the first thickness 112 is between about twenty angstroms to about one-hundred and twenty angstroms and the second thickness 114 is between about five angstroms and about twenty angstroms. In the exemplary embodiment of FIG. 1B, the second thickness 114 of the second metal oxide layer 108 is thicker than the first thickness 112 of the first metal oxide layer 106. In one embodiment, the second thickness 114 is between about twenty angstroms to about one-hundred and twenty angstroms and the first thickness 112 is between about five angstroms and about twenty angstroms.

The composite diffusion layer 110 has a third thickness 116 and is said to be composite in that it has (1) a region with a lower oxygen content relative to the first metal oxide layer 106 and the second metal oxide layer 108 and (2) a certain non-diffused region that is substantially the metal being deposited and insulative because of its thinness. In one embodiment, the third thickness 116 is between about ten angstroms and about forty angstroms. In one embodiment, the first and second strips 122, 124 are optically opaque. In another embodiment, the first and second strips 122, 124 are optically transparent. In one embodiment, one strip is optically opaque and the other strip is optically transparent. In one such embodiment, the first strip 122 is optically transparent and the second strip 124 is optically opaque. In another embodiment, the first strip 122 is optically opaque and the second strip 124 is optically transparent. To render the strips optically opaque they may have, in some embodiments, a thickness of at least 40 nm. This also permits the strips to be sufficiently thick to have low resistivity. In one embodiment, the strips are between 40 nm and 4000 nm thick, although the thickness will vary with the composition of the strips to provide the proper combination of optical and electrical properties. For example, aluminum strips may be about one hundred nm thick, indium tin oxide strips may be about 300 nm thick while graphene strips may be about 1 nm thick.

A plurality of elongated, electrically conductive strips are disposed on top surface 118 of the substrate 102. The top surface 118 comprises the smooth surface 104. The top surface 118 is opposite the bottom surface 120 of the substrate 102. The top surface 118 is the surface that directly contacts the first strip 122. The first strip 122 and second strip 124 are separated by the first and second metal oxide layers 106, 108 and the composite diffusion layer 110. A top view of the first strip 122 and the second strip 124 is provided in FIG. 4.

Figure 2:
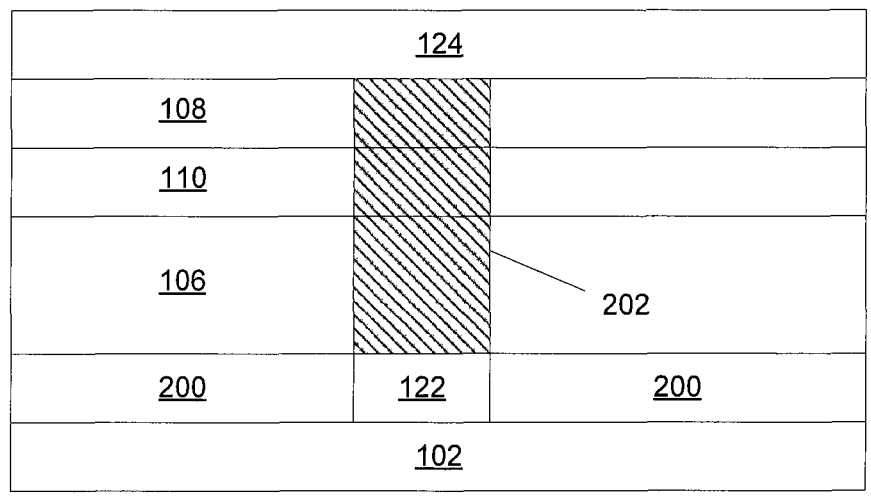
FIG. 2 is a schematic cross section of another exemplary light-responsive device.

In FIGS. 1A and 1B, the second strip 124 includes steps that track the cross sectional profile created by the first strip 122. Due to the low thickness 126 of the multilayered structure (106, 108, 110) the resulting device has acceptable properties. In some embodiments it may be advantageous to provide a flat second strip 124. For example, in FIG. 2, a filler layer 200 is deposited on the insulating substrate. The filler layer 200 may, after deposition, be polished to provide a smooth top surface for receiving the first metal oxide layer 106. The filler layer 200 may be comprised of an insulator, such as silicon dioxide or the like. A junction 202 is also depicted in FIG. 2.

Device 100 may be formed by, for example, a sputtering process. By controlling the sputtering conditions, including the presence of gases in the sputtering chamber, the composition of the layers may be controlled. By controlling other sputtering conditions, including the time of exposure and temperature of the substrate, the thickness of the metal oxide layers and thickness of the composite diffusion layer may be controlled. Data for four exemplary multilayered structures are presented in FIG. 3. The thicknesses of the composite diffusion layer, including the nondiffused regions are indicated by the values separated by a slash in FIG. 3.

Referring to FIG. 3, a silicon wafer (Si(100)) includes a surface layer of silicon dioxide, the thickness of which is shown in the table of FIG. 3. Various samples of HfO—Hf—HfO were sputtered onto silicon substrates, with an aluminum under contact strip, which exhibited distinctly diode-type current versus voltage curves which were photosensistive to white light illumination or to illumination by red or green laser light. Light sensitivity was obtained by illuminating the region of the lower and upper aluminum cross strip intersection. The film layers were deposited in a sputtering chamber via DC magnetron sputtered using 3 kV from a hafnium (Hf) metal target using different gases for different times. The substrate temperature was 350° C. for all layers. In sample 1, the first metal oxide layer was deposited in the presence of 34 mTorr of oxygen for 20 minutes. The substrate temperature was sufficiently high so that diffusion occurred between the fully oxidized and lesser oxidized regions. The first metal oxide layer (in this case, hafnium oxide) is relatively oxygen rich and fully insulating. Thereafter, sputtering continued for 11 minutes in the presence of 12 mTorr of argon. Given the elevated temperatures in the sputtering chamber, the resulting composite diffusion layer contains some oxygen and a further more oxygen deficient region hence the characterization as a composite region. After the composite diffusion layer has been deposited, sputtering continued for 8 minutes in the presence of 34 mTorr of oxygen. The resulting second metal oxide layer was oxygen rich, relative to the composite diffusion layer and has approximately the same oxygen content as the first metal oxide layer. Analysis of the composite diffusion layer shows an oxygen-deficient $HfO_x$ layer with a thickness of 39.6 angstroms (as the residual oxygen is consumed) and an oxygen-free Hf layer of 21.2 angstroms thickness. In sample 1 the first metal oxide layer is thicker than the second metal oxide layer due to the longer sputtering time (20 minutes vs 8 minutes). The other examples in FIG. 3 (samples 3-4) show different exemplary thicknesses. X-ray reflectivity fitting indicated that a Hf—O composite diffusion layer formed at the initial $HfO_2$—Hf interface. The introduction of a composite diffusion layer was desirable to allow x-ray reflectivity fitting. The thicknesses were determined from reflectivity fitting values. In the prototype device hafnium oxide/hafnium layers have been used as a material whose dielectric and electrical conducting properties are changed under light illumination, but other materials for which the dielectric and electrical properties can be changed under light illumination would be apparent to those skilled in the art after benefiting from reading this specification. Examples of other metals include tantalum and titanium.

The overall thickness of the multilayered structure is less than 10 nm and, in one embodiment, is less than about two-hundred angstroms. In principle junction cell elements can be placed with a lateral separation of approximately twice the cell thickness. The smallest junction cell size is then about 300 Å×300 Å for a maximum cell density of about $10^{11}$ per square cm which is equivalent to about $6.5×10^{11}$ per inch squared. This is equivalent to an areal density of $650×10^9$ per square inch. Maximum usable cell densities can be set by lithographic considerations rather than any material limitations.

FIG. 4 is a top view of the device 100 of FIG. 1. The first strip 122 extends in a first direction 441 while the second strip 124 extends in a second direction 442. The first direction 441 and the second direction 442 are different such that the first strip 122 and the second strip 124 cross to form a first junction 451. In the embodiment of FIG. 4, the first direction 441 and the second direction 442 are perpendicular such that a right angle is formed between the first strip 122 and the second strip 124. In another embodiment, the first direction 441 and the second direction 442 are non-parallel such that the first junction 451 is formed, but the angle of junction is not a right angle. The plurality of elongated, electrically conductive strips may be formed from a variety of suitable materials including, for example, aluminum. In one embodiment, the plurality of elongated, electrically conductive strips are formed from an optically transparent material, such as graphene or indium tin oxides. Such materials provide certain benefits in certain embodiments which are discussed in detail elsewhere in this specification.

Figure 5:
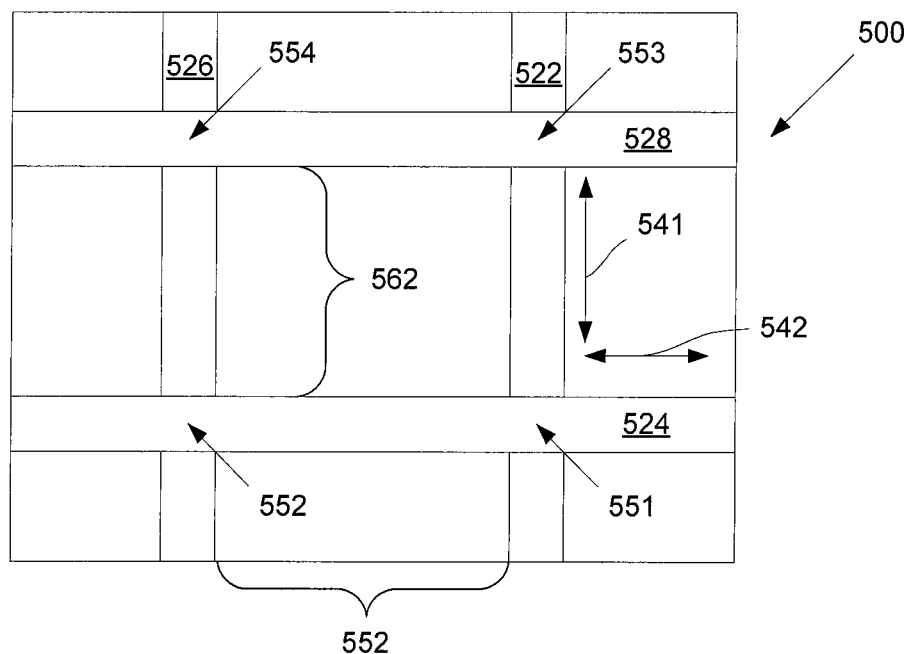
FIG. 5 is a top view of another exemplary device.

FIG. 5 is a top view of the device 500 which is similar to device 100 except in that additional strips are provided to form an array. The device 500 comprises first strip 522 and second strip 524 which extend in a first direction 541 and a second direction 542, respectively. The device 500 further comprises a third strip 526 that extends in the first direction 541 and a fourth strip 528 that extends in the second direction 542. The first strip 522 and third strip 526 are both coplanar, parallel and are spaced from one another by a gap 560. The second strip 524 and the fourth strip 528 are both coplanar, parallel and are spaced from one another by a gap 562. The plane of the first and third strip 522, 526 is separated from the plane of the second and fourth strip 524, 528 by the multilayered structure (including the first and second metal oxide layers and the composite diffusion layer). The first strip 522 and the third strip 526 cross the second strip 524 to form a first junction 551 and a second junction 552. Likewise, the first strip 522 and the third strip 526 cross the fourth strip 528 to form a third junction 553 and a fourth junction 554.

Figure 6:
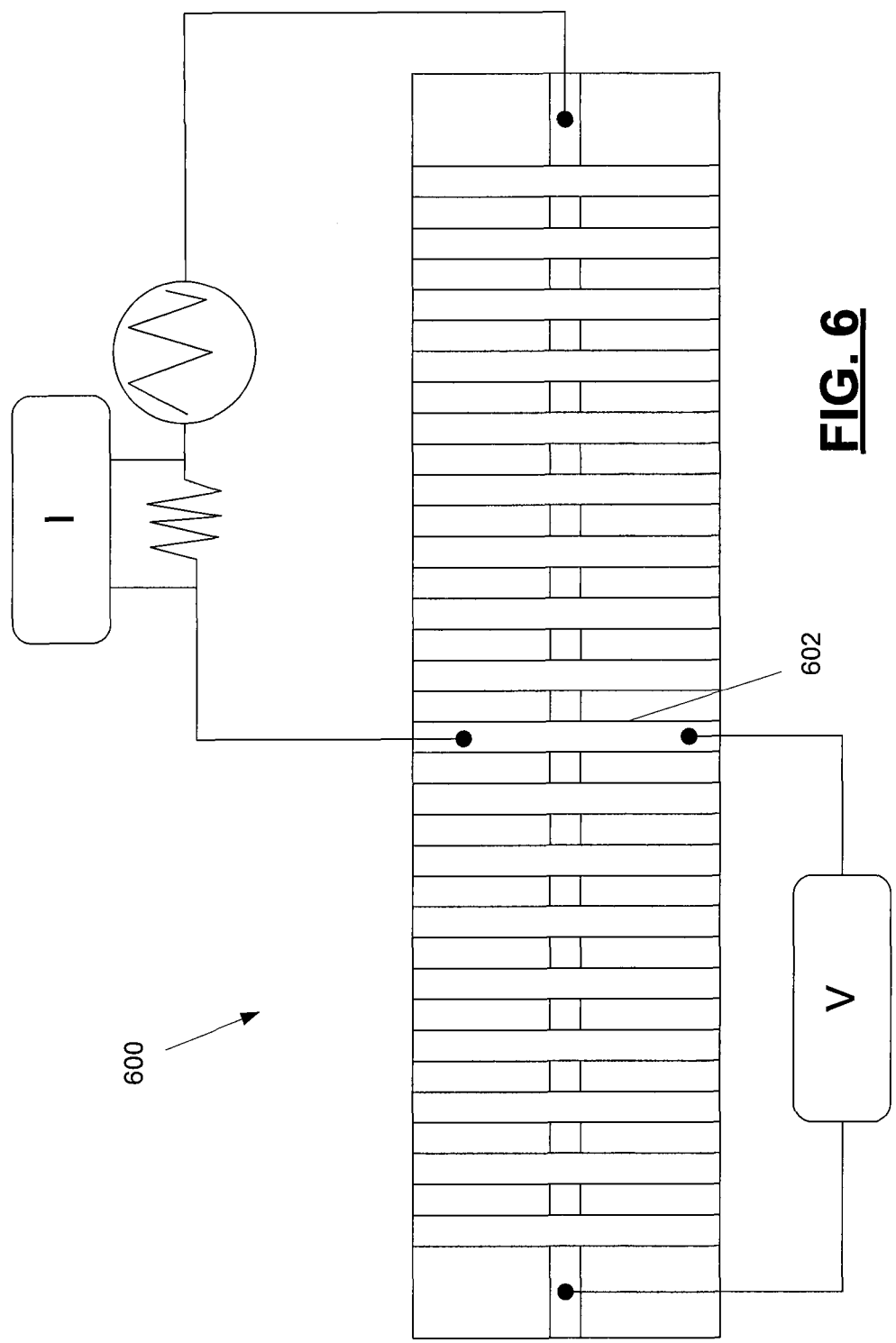
FIG. 6 is a depiction of a four-terminal current and voltage connections for an exemplary device.

As shown in FIG. 6, individual regions or junctions have been made by initially depositing a set of conducting stripes, the metal oxide layered structure, and then another set of conducting stripes. Individual junctions, also known as pixels or memory cells, could be sampled by changing the interior current and voltage connections to different cross strips. In the exemplary embodiment of FIG. 6, cross strip 602 is selected. In general one of the top conducting strips can be assigned an index Xn, and one of the bottom conducting strips an index Ym. A set on indices (Xn,Ym) can then be used to reference any individual junction. For illustration purposes only one lower conducting stripe is shown in FIG. 6, but in general there can be a large number of lower conducting stripes. A waveform generator with selectable sine, triangle, square wave or DC outputs was used and the current sampling resistor was 10 k-ohm or greater. Preliminary characterization of the metal oxide layered structures were made without the use of any conductive stripes, two current contacts were attached to the film structure at a spacing of approximately 2 cm. Interior to these spots two voltage probes were attached at a spacing of approximately 1 cm. In these tests contacts were made by dots of silver paints. A DC ohm-meter pressed to the sample surface at a spacing of 1 mm indicated greater than 50 MΩ resistance on the maximum 50 MΩ scale. In contrast to this probes placed similarly on a bare Si substrate indicated about 300 KΩ resistance.

Figure 7:
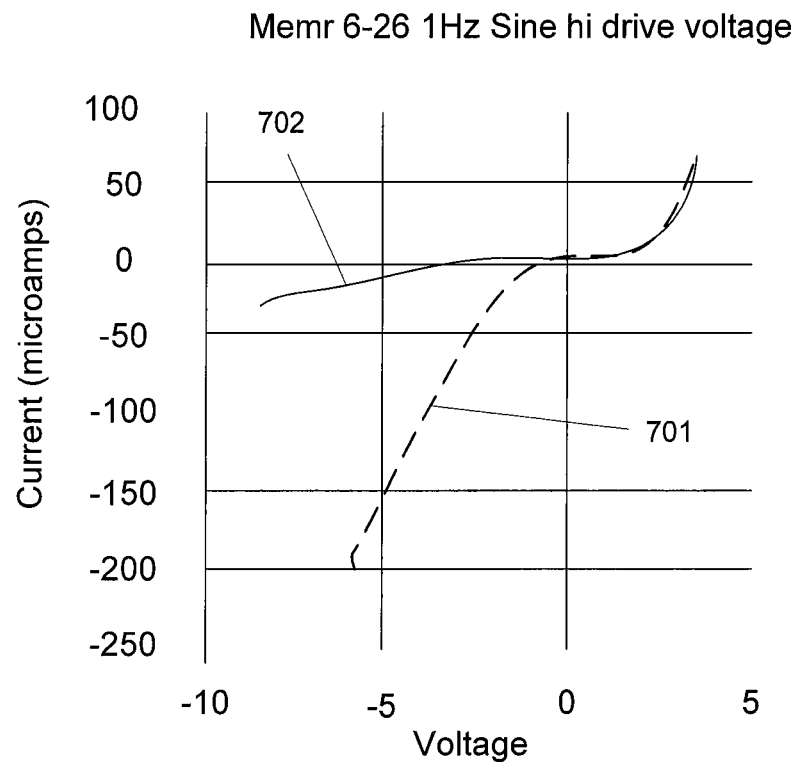
FIG. 7 illustrates exemplary current versus voltage curves for the device of FIG. 6.

FIG. 7 illustrates exemplary current versus voltage curves for device 600 when driven at 1 Hz by a sine wave when exposed to bright white light (line 701) and relative darkness (line 702). The polarity of the voltage setting may vary with the configuration of a particular device. Generally, the junction resists electrical current when not biased with a voltage of the proper polarity or when the junction is not exposed to light. The resistivity of the junction is lower when both biased with a voltage of the proper polarity and when exposed to light. The light responsiveness of the device is the same for lines 701 and 702 when the device is biased with a positive voltage. However, when the device is biased with a negative voltage, the lines 701 and 702 respond differently. In dark conditions, there is relatively little current in line 702. Conversely, in light conditions, there is a relatively large current inline 701. If the junction is in the dark at a negative bias voltage, for example of −4 volts, and then light of increasing intensity is applied to the junction, the junction current becomes more negative and then saturates for some relatively high light intensity. It should be noted that because the thin film structure exhibits a high lateral electrical resistance that it has not been necessary to pattern the thin film structure in any way to have each junction region act independent of any other junction region. The light responsiveness of the device has been shown to be reversible such that the system rapidly returns to its darkness behavior when light is removed. Appreciable response has been observed for light pulses as short as 14 microseconds but this is not a minimum response time.

Figure 8:
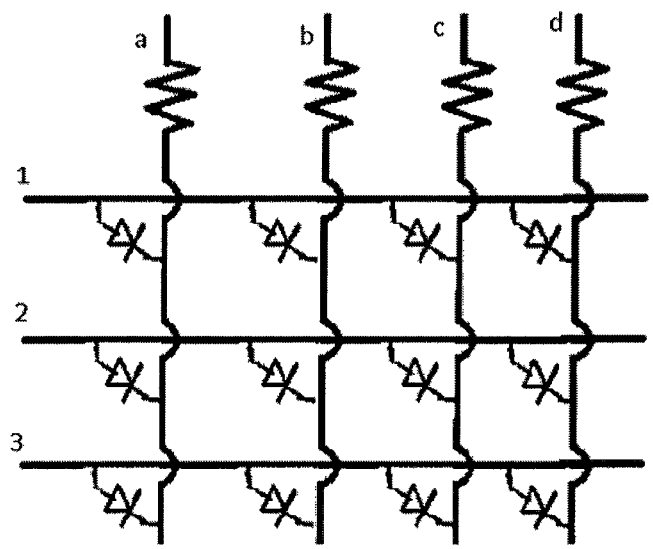
FIG. 8 is a schematic depiction of an array of junctions where the junctions are depicted as diodes.

FIG. 8 is a schematic depiction of an array of junctions where the junctions are depicted as diodes. Conducting strips, arranged in rows, are designated by the numeric index: 1, 2, 3, . . . , n. The multi layer structure designated by for example $HfO_2$—$HfO_x$—Hf—$HfO_2$ is represented by the diode symbols in the figure. These film layers do not need to be patterned but for illustrative purposes the diode symbols show a connection to a top set of conductive strips arranged here in columns as designated by the lower case letters: a, b, c, . . . z. The total array size is given by n×z where n and z can be large with each line intersection defining an effective pixel. Each pixel region can be covered with a colored filter so that light incident with the colors red, green, and blue, for example can be distinguished in an image. The voltage across the current sensing resistor plus the voltage across the junction equals the applied voltage. There is the added provision that the junction voltage should be within an expected range for the junction current to be declared valid. These tests aid in properly identifying a particular junction and in discarding any measurements from individual junctions that may be shorted or faulty in some other way.

Figure 9:
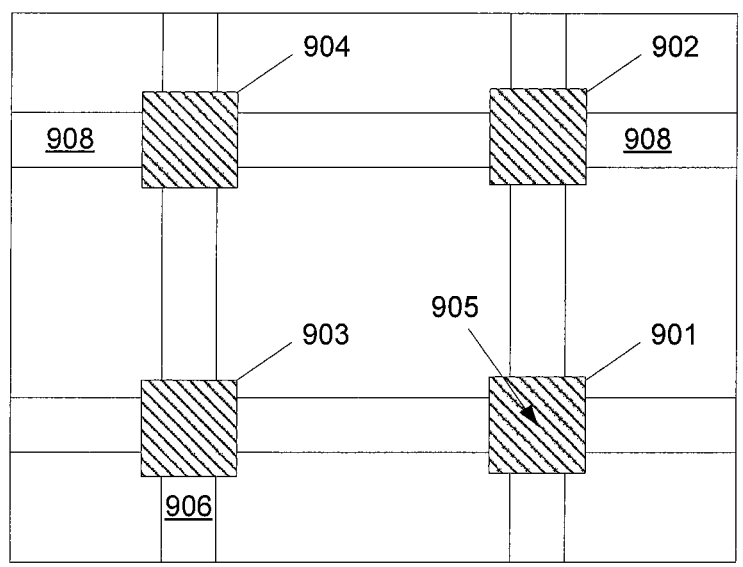
FIG. 9 is a top view of an embodiment using light filters.

In one embodiment, depicted in FIG. 9, filters may be used to selectively filter a color of incoming light. A light filter, such as light filter 901, is disposed above junction 905 to filter the color (wavelength) of incoming light that reaches the junction. By using a plurality of different filters (901-904), each permitting passage of a different wavelength of light, a color-sensitive array may be constructed. For example, light filter 904 may be selective to red light, while light filter 902 is selective to blue light. If, upon exposure to light, current flow is detected between strips 906, 908 then one can determine that red light was present in the light. The junctions may therefore serve as color sensitive photodetector. Such junctions also have the added variability that light sensitivity can also be used to modulate or change the junction state values. Such media could also then be made for optical readout.

In one embodiment, each junction is separated by a high lateral electrical resistance of the film structure and therefore can act independently. Each column has a voltage sensing resistor and can be identified as $R_a$, $R_b$, etc. Each $R_j$ is chosen to be much less than the effective reverse bias resistance of the represented diode element. Light incident on any effective pixel unit lowers the back resistance of the intersecting region but the condition that $R_j$ be much than the diode element back resistance still holds. An image pattern of where light has been incident can then be read by scanning a voltage (e.g. −4 V) to the contact set ij where i represents a numeric row and j an alphabetical column index. When, for example, i=3, j=b, then a measurement of the voltage across resistor b versus the dark current voltage across resistor Rb is an indicator of the amount of light incident on pixel region 3b.

The pattern of cross tie conductor strips may be repeated at several different directions so that three dimensional junction structures are fabricated. Each cell layer would have a high lateral density so that the effective overall density per square inch would be increased by a factor equal to the number of cell layers. In the exemplary device geometry aluminum has been used as an electrically conducting top and bottom layer, but any other electrical conductor or combination of conductors usable for thin conducting strips whether opaque or transparent is expected to be usable.

Figure 10:
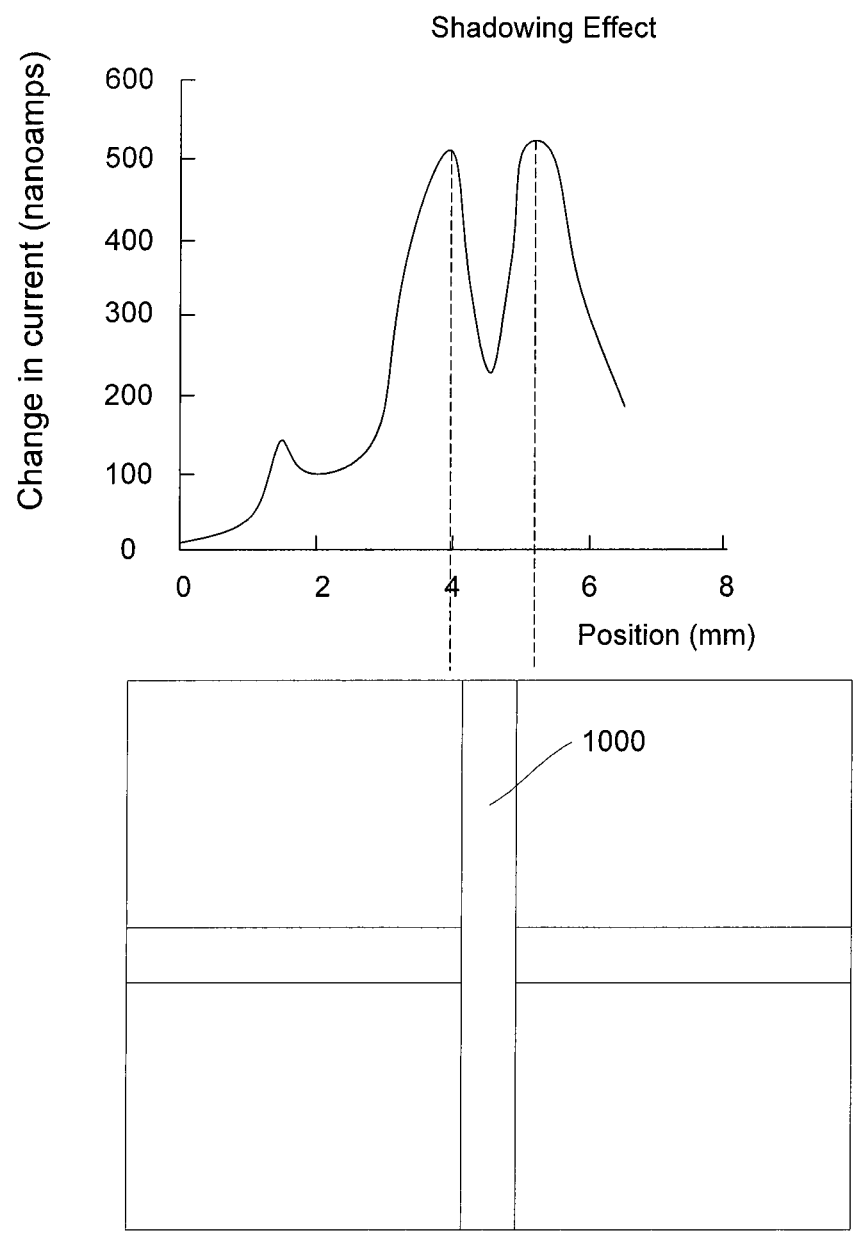
FIG. 10 shows a shadowing response in the vicinity of an aluminum cross strip.

FIG. 10 shows the relative light response for red light illumination from an optical fiber scanned in the vicinity of an aluminum cross strip 1000. The aluminum cross strips had a width of 1 mm and are spaced by 1 mm. The aluminum cross strip shadows the optical response since the aluminum cross strips are optically opaque. It should be noted that the response falls off even as the next cross strip is crossed.

Figure 11:
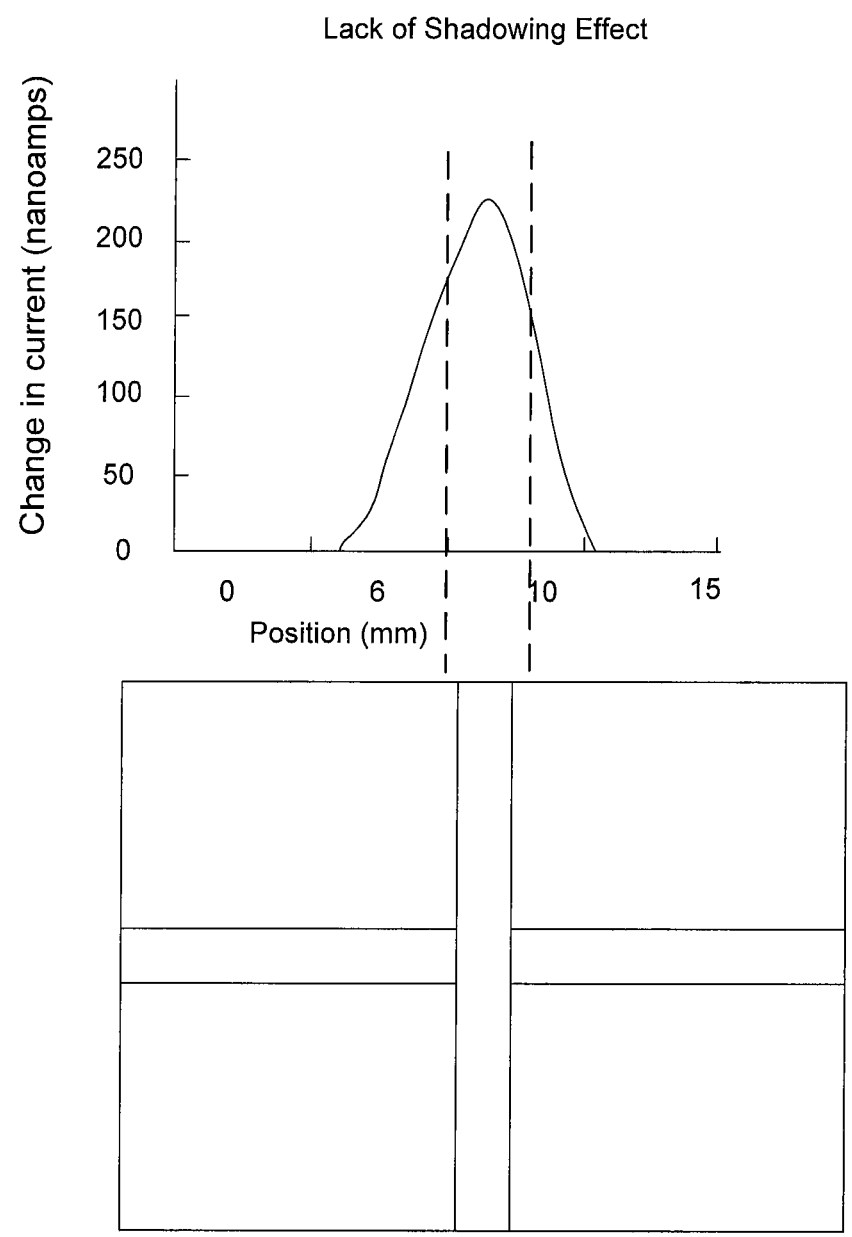
FIG. 11 shows the lack of a shadowing response in the vicinity of an optically transparent cross strip.

As illustrated in FIG. 11 the use of transparent conducting strips can be used to eliminate the shadowing effect of opaque conductive strips. In this case graphene strips have been used but other transparent electrical conductors may also work for this purpose. Suitable materials include indium tin oxide, graphene, or any other optically transparent conductor which can be used for the top strips. FIG. 11 shows the relative light response for red light illumination from an optical fiber scanned along the length of the lower aluminum strips in the vicinity of a graphene cross strips. No shadowing effect is observed. If a transparent substrate were used to provide backside sensitivity then it may also be desirable to use transparent lower conducting strips to avoid shadowing for backside illumination sensitivity. The graphene top stripes were added to an un-patterned hafnium oxide layered film structure courtesy of Roman Caudillo.

Figure 12:
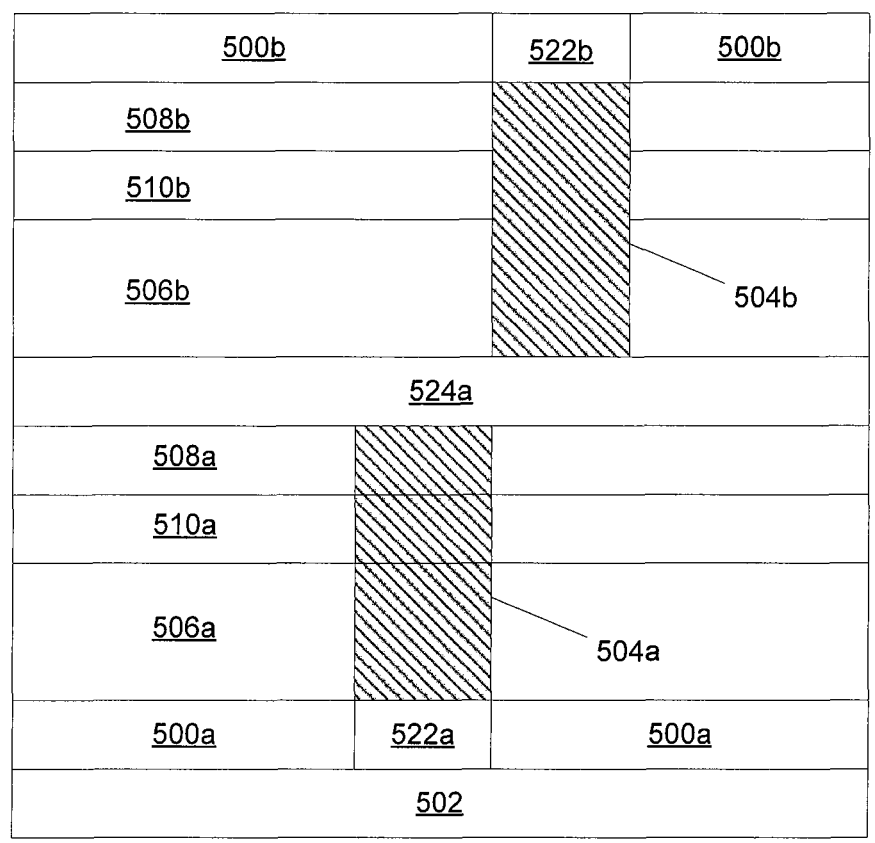
FIG. 12 depicts a multi-layered device.
Figure 13:
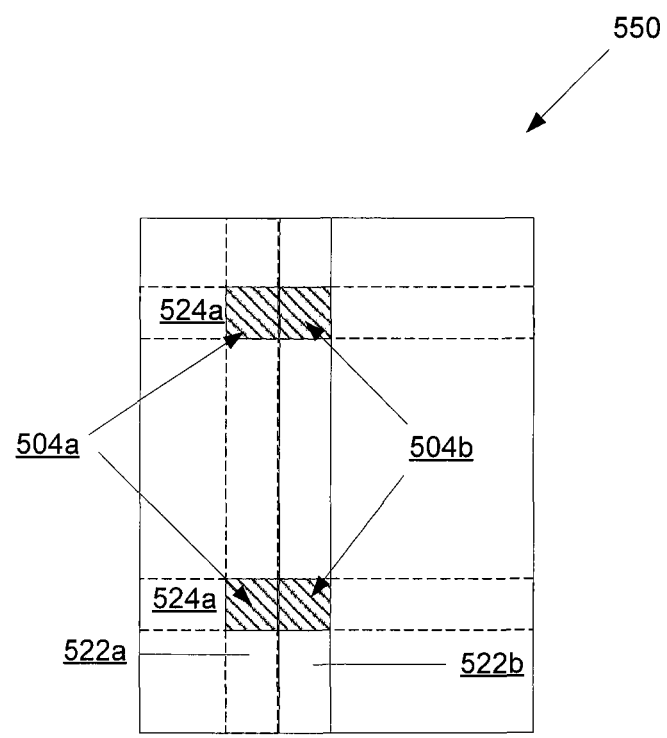
FIG. 13 is a top view of the multi-layered device of FIG. 12.

FIG. 12 depicts a multi-layered light sensor 550. Light sensor 550 comprises an insulating substrate 502 which, in one embodiment, is optically transparent. A first conductive strip 522a is disposed atop the insulating substrate 502. In the exemplary embodiment of FIG. 12, a filler layer 500a is used to planarize the exposed top surface. A first multilayered structure is then deposited on the first strip 522a. The first multilayered structure comprises a first metal oxide layer 506a, a second metal oxide layer 508a, a composite diffusion layer 510a. A second strip 524a is located above the multilayered structure to produce a first junction 504a. A second multilayered structure is then deposited on the second strip 524a wherein the second strip 524 functions as a smooth surface. In some embodiments, a filler layer is used to surround the second strip 524 to planarize the smooth surface. The second multilayered structure comprises a first metal oxide layer 506b, a second metal oxide layer 508b, a composite diffusion layer 510b. A third strip 522b, which extends parallel to the first strip 522a, is located on the second multilayered structure to form a second junction 504b. The third strip 522b is laterally offset from the first strip 522a such that the resulting first junction 504a and second junction 504b are staggered. A filler layer 500b may be used to planarize the top surface of the third strip 522b and provide a smooth surface for subsequent layers. Although only two multilayered structures are shown in FIG. 12, additional layers may also be present. A top view of the multi-layered light sensor 550 is shown in FIG. 13 showing four junctions. This depiction is merely one example. Multiple strips may be used to stagger multiple junctions at predetermined intervals. In another embodiment, multiple junctions are vertically stacked, rather than staggered. Since the components of select embodiments are optically transparent, such vertically stacked junctions may increase the sensitivity to incident light at the stacking location.

Figure 14:
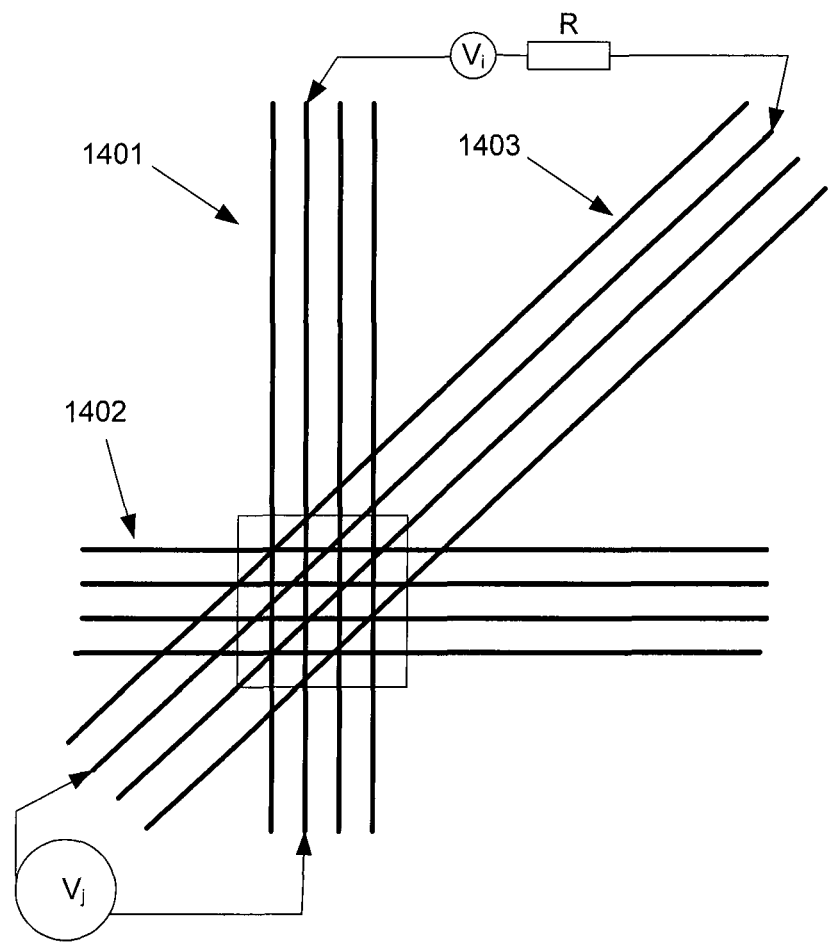
FIG. 14 is a top view of a pattern of cross tie conductor strips that is repeated at several different directions.

FIG. 14 is a top view of a pattern of cross tie conductor strips that is repeated at several different directions so that three dimensional junction structures are fabricated. In the exemplary embodiment, only three sets of strips are shown. In other embodiments, additional strips may be present. Like FIG. 13, three conductor strips are present including a first plurality of strips 1401, a second plurality of strips 1402 and a third plurality of strips 1403. The first plurality of strips 1401 and the second plurality of strips 1402 are disposed at a right angle relative to one another. The third plurality of strips 1403 are disposed at an acute angle relative to the first plurality of strips 1401 and the second plurality of strips 1402. The junctions of the embodiment of FIG. 14 are generally stacked, rather than staggered. Because the junctions are light responsive only when a proper bias voltage is applied, individual junctions can be selectively addressed, even in a stacked configuration. For example, a bias with the proper polarity may be applied to the second strip of the plurality of second strips 1402 and to the second strip of the plurality of third strips 1403. The junction that corresponds to these two strips then becomes properly biased and, if light is present at that junction, electrical current can flow at the select junction. The ability to selectively activate a particular junction provides a number of distinct advantages, including the ability to test the device for shorts and other failures.

Exemplary light sensitive applications include single cell or multiple cell arrays, image sensors, in either single layer or multiple layer array light detectors. Such arrays can function as light sensing detectors. Such sensors can also be used for on-chip communication receivers with the added utility that if transparent substrates are used communication can be made between components on opposite surfaces of the same substrate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A light-responsive device comprising:
a plurality of first elongated electrically conductive strips comprising at least a first strip;
a plurality of second elongated electrically conductive strips comprising at least a second strip, the first strip extending in a first direction and the second strip extending in a second direction, different than the first direction, such that the second strip crosses the first strip to form a first junction, the second strip being spaced from the first strip such that the first junction is between the first strip and the second strip;
a multilayered structure comprising a first metal oxide layer, a second metal oxide layer, and a composite diffusion layer, each disposed between the plurality of first elongated electrically conductive strips and the plurality of second elongated electrically conductive strips, wherein:
the composite diffusion layer comprising a first region that is oxygen deficient relative to the first metal oxide layer and the second metal oxide layer, a non-diffused region that provides an insulation region, and a second region that is oxygen deficient relative to the first metal oxide layer and the second metal oxide layer, the non-diffused region being between, and contiguous with, the first region and the second region, the composite diffusion layer being disposed between, and contiguous with, the first metal oxide layer and the second metal oxide layer;
the first metal oxide layer having a first thickness and the second metal oxide having a second thickness, wherein the first thickness and second thickness are different, wherein the first junction resists electrical current when (1) not biased with a first polarity or (2) not exposed to light or (3) biased with a second polarity, opposite the first polarity and the first junction is less resistive to electrical current when biased with the first polarity and exposed to light.

2. The device as recited in claim 1, wherein the first metal oxide layer is a first hafnium oxide layer, the second metal oxide layer is a second hafnium oxide layer and the composite diffusion layer comprises an oxygen-deficient hafnium oxide layer.

3. The device as recited in claim 1, wherein the first strip and second strip comprise an optically opaque conducting material.

4. The device as recited in claim 1, wherein the first strip and second strip comprise an optically transparent conducting material.

5. The device as recited in claim 1, wherein the first strip comprises an optically opaque conducting strip and the second strip comprises an optically transparent conducting material.

6. The device as recited in claim 1, wherein the first strip comprises an optically transparent conducting strip and the second strip comprises an optically opaque conducting material.

7. The device as recited in claim 1, wherein the first strip comprises an optically transparent conducting material and the second strip comprises an optically transparent conducting material.

8. The device as recited in claim 1, wherein the first thickness is thicker than the second thickness.

9. The device as recited in claim 8, wherein the first thickness is between about 20 angstroms to about 120 angstroms and the second thickness is between about 5 angstroms and about 20 angstroms.

10. The device as recited in claim 9, wherein the composite diffusion layer has a third thickness between about 10 angstroms and about 40 angstroms.

11. The device as recited in claim 1, wherein the second thickness is thicker than the first thickness.

12. The device as recited in claim 11, wherein the second thickness is between about 20 angstroms to about 120 angstroms and the first thickness is between about 5 angstroms and about 20 angstroms.

13. The device as recited in claim 12, wherein the composite diffusion layer has a third thickness between about 10 angstroms and about 40 angstroms.

14. The device as recited in claim 1, wherein the first metal oxide layer is deposited on a smooth surface of a substrate, the smooth surface having a surface roughness of 20 angstroms or less.

15. The device as recited in claim 1, wherein the first metal oxide layer is disposed above a smooth surface of an optically transparent substrate.

16. The device as recited in claim 1, wherein the first metal oxide layer is a first titanium oxide layer or a first tantalum oxide layer, the second metal oxide layer is a second titanium oxide layer or a second tantalum oxide layer and the composite diffusion layer comprises an oxygen-deficient titanium oxide layer or an oxygen-deficient tantalum oxide layer.

17. A multi-layered light sensor comprising:
a light-responsive device as recited in claim 1, the multi-layered light sensor further comprising:
a second multilayered structure disposed on the second strip; and
a plurality of third elongated electrically conductive strips disposed on the second multilayered structure, the third strip and second strip forming a second junction.

18. A light sensor comprising:
a plurality of first elongated electrically conductive strips comprising at least a first strip;
a plurality of second elongated electrically conductive strips comprising at least a second strip, the first strip extending in a first direction and the second strip extending in a second direction, different than the first direction, such that the second strip crosses the first strip to form a first junction, the second strip being spaced from the first strip such that the first junction is between the first strip and the second strip;
a multilayered film structure comprising a first metal oxide layer, a second metal oxide layer, and a composite diffusion layer, each disposed between the plurality of first elongated electrically conductive strips and the plurality of second elongated electrically conductive strips, wherein:

the composite diffusion layer comprising a first region that is oxygen deficient relative to the first metal oxide layer and the second metal oxide layer, a non-diffused region that provides an insulation region, and a second region that is oxygen deficient relative to the first metal oxide layer and the second metal oxide layer, the non-diffused region being between, and contiguous with, the first region and the second region, the composite diffusion layer being disposed between, and contiguous with, the first metal oxide layer and the second metal oxide layer;

the first metal oxide layer having a first thickness and the second metal oxide having a second thickness, wherein the first thickness and second thickness are different, wherein the first junction resists electrical current when (1) not biased with a first polarity or (2) not exposed to light or (3) biased with a second polarity, opposite the first polarity and the first junction is less resistive to electrical current when biased with the first polarity and exposed to light;

the plurality of first elongated electrically conductive strips comprising a third strip, spaced from the first strip, the first and third strip being coplanar and extending in a first direction;

the plurality of second elongated electrically conductive strips comprising a fourth strip, spaced from the second strip, the second and fourth strip being coplanar and extending in a second direction, different than the first direction, the second strip crosses the first strip and the third strip to form the first junction and a second junction, respectively;

the fourth strip crosses the first strip and the third strip to form a third junction and a fourth junction, wherein the multilayered film structure is contiguous with at least the first junction and the second junction.

19. The light sensor as recited in claim 18, further comprising at least a first light filter and a second light filter, disposed above the first junction and second junction, respectively, to filter a color of incoming light.

20. The light sensor as recited in claim 18, wherein the combined thickness of the first metal oxide layer, the composite diffusion layer, and the second metal oxide layer is less than about 10 nm.

21. The light sensor as recited in claim 18, wherein the non-diffused region consists essentially of an oxide-free metal.

22. The device as recited in claim 1, wherein the non-diffused region consists essentially of an oxide-free metal.

* * * * *